(12) United States Patent
Lim et al.

(10) Patent No.: US 10,907,247 B2
(45) Date of Patent: Feb. 2, 2021

(54) APPARATUS AND METHOD FOR PROCESSING SPUTTERED IC UNITS

(71) Applicant: ROKKO SYSTEMS PTE LTD, Singapore (SG)

(72) Inventors: Chong Chen Gary Lim, Singapore (SG); Seung Ho Baek, Singapore (SG); Jong Jae Jung, Singapore (SG); Yun Suk Shin, Singapore (SG); Deok Chun Jang, Singapore (SG)

(73) Assignee: ROKKO SYSTEMS PTE LTD, Singapore (SG)

( * ) Notice: Subject to any disclaimer, the term of this patent is extended or adjusted under 35 U.S.C. 154(b) by 467 days.

(21) Appl. No.: 15/503,694

(22) PCT Filed: Aug. 12, 2015

(86) PCT No.: PCT/SG2015/050257
§ 371 (c)(1),
(2) Date: Feb. 13, 2017

(87) PCT Pub. No.: WO2016/024917
PCT Pub. Date: Feb. 18, 2016

(65) Prior Publication Data
US 2017/0260623 A1 Sep. 14, 2017

(30) Foreign Application Priority Data

Aug. 13, 2014 (SG) .......................... 10201404879 U

(51) Int. Cl.
*C23C 14/34* (2006.01)
*C23C 14/50* (2006.01)
(Continued)

(52) U.S. Cl.
CPC .............. *C23C 14/50* (2013.01); *C23C 14/34* (2013.01); *H01L 21/67132* (2013.01);
(Continued)

(58) Field of Classification Search
CPC ................................ C23C 14/50; C23C 14/34
See application file for complete search history.

(56) References Cited

U.S. PATENT DOCUMENTS 5,421,889 A * 6/1995 Pollock ................... C23C 16/54
118/719
5,991,699 A * 11/1999 Kulkarni ................. H01L 22/20
257/E21.525
(Continued)

FOREIGN PATENT DOCUMENTS

| CN | 1665012 A | 9/2005 |
|---|---|---|
| JP | 2001332521 A | 11/2001 |

(Continued)

OTHER PUBLICATIONS

Foreign Communication from a Related Counterpart Application, Office Action dated Jul. 4, 2018, China Application No. 201580054591.3.

(Continued)

*Primary Examiner* — Jason Berman

(57) ABSTRACT

A method for preparing a film carrier for sputtering of IC units placed thereon, the method comprising the steps of: providing a carrier of IC units; removing said units from the carrier; delivering said IC units to a flipper; inverting and delivering said units to a sputtering film frame; placing the units on said sputtering film frame in an array having a pre-determined clearance about adjacent units.

5 Claims, 7 Drawing Sheets

(51) Int. Cl.
H01L 21/67 (2006.01)
H01L 21/683 (2006.01)

(52) U.S. Cl.
CPC .. *H01L 21/67144* (2013.01); *H01L 21/67265* (2013.01); *H01L 21/6836* (2013.01); *H01L 2221/68386* (2013.01)

(56) References Cited

U.S. PATENT DOCUMENTS

| | | | |
|---|---|---|---|
| 6,413,037 B1* | 7/2002 | Brodine | B65G 49/061 |
| | | | 294/189 |
| 6,547,076 B1* | 4/2003 | Pylant | B65D 75/327 |
| | | | 206/713 |
| 2002/0004288 A1* | 1/2002 | Nishiyama | H01L 21/561 |
| | | | 438/464 |
| 2009/0294930 A1 | 12/2009 | Yoon et al. | |

FOREIGN PATENT DOCUMENTS

| | | |
|---|---|---|
| WO | 2006022597 A2 | 3/2006 |
| WO | 2016024917 A1 | 2/2016 |

OTHER PUBLICATIONS

Foreign Communication From a Related Counterpart Application, International Search Report and Written Opinion dated Nov. 10, 2015, International Application No. PCT/SG2015/050257 filed on Aug. 12, 2015.

* cited by examiner

APPARATUS AND METHOD FOR PROCESSING SPUTTERED IC UNITS

CROSS-REFERENCE TO RELATED APPLICATIONS

The present application is a filing under 35 U.S.C. 371 as the National Stage of International Application No. PCT/SG2015/050257, filed Aug. 12, 2015, entitled "APPARATUS AND METHOD FOR PROCESSING SPUTTERED IC UNITS," which claims the benefit of and priority to Singapore Application No. 10201404879U, filed with the Intellectual Property Office of Singapore on Aug. 13, 2014, both of which are incorporated herein by reference in their entirety for all purposes.

FIELD OF THE INVENTION

The invention relates to the processing of IC units following their singulation from a substrate. In particular, the invention relates to processing of said IC units intended for a sputtering process.

BACKGROUND

With the growth in smart phone technology, the pressure for the placement of analog components in close proximity is also growing, and consequently, the requirement for, the elimination of interference from adjacent components. EMI shielding which is used to block noise and electromagnetic interference generated from RF modules is developing as a new technology and is seen as the process of choice in order to overcome these issues.

To this end, components received a sputtered metal coating of a variety of suitable materials providing high electrical conductivity and electromagnetic shielding efficiency. The introduction of the sputtered process for the processing of IC units complicates the manufacturing process by not only introducing a new process but interrupting that process to remove the IC units to a special environment for the application of the sputtered coating.

Further, the arrangement of the IC units in order for the sputtering process to be successful, is contrary to the efficient processing of these units, and so the interruption is not only in the process, but in the handling of the individual units.

SUMMARY OF INVENTION

In a first aspect the invention provides a method for preparing a film carrier for sputtering of IC units placed thereon, the method comprising the steps of: providing a carrier of IC units; removing said units from the carrier; delivering said IC units to a flipper; inverting and delivering said units to a sputtering film frame; placing the units on said sputtering film frame in an array having a pre-determined clearance about adjacent units.

In a second aspect the invention provides a method for re-distributing IC units on a sputtering film frame, the method comprising the steps of: providing the sputtering film frame of sputtered IC units in an array having a pre-determined clearance about adjacent units, and; inspecting the units from below the sputtering film frame; removing said units from the sputtering film frame.

In a third aspect the invention provides a device for preparing a film carrier for sputtering of IC units placed thereon comprising: a loading station for loading a carrier of IC units into said device; a unit picker arranged to remove said units from the carrier and deliver said IC units to a flipper, said flipper arranged to invert said units; wherein said unit picker is arranged to deliver said units from the flipper to a sputtering film frame in an array having a pre-determined clearance about adjacent units.

In a fourth aspect the invention provides a device for re-distributing IC units on a sputtering film frame, the device comprising: a loading station for loading the sputtering film frame of sputtered IC units in an array having a pre-determined clearance about adjacent units into said device; a unit picker arranged to remove said units from the sputtering film frame and; wherein said unit picker is further arranged to place the sputtered units in a tray and a tray picker arranged to deliver the tray to an unloading station.

Accordingly, the invention provides for a preparatory process for the delivery of IC units from a singulation process to an arrangement suitable for sputtering under clean room conditions.

The invention further provides for the conversion of this arrangement in a post-sputtering process to repackage the IC units for delivery to components assembly clients.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

DETAILED DESCRIPTION

Figure 1:
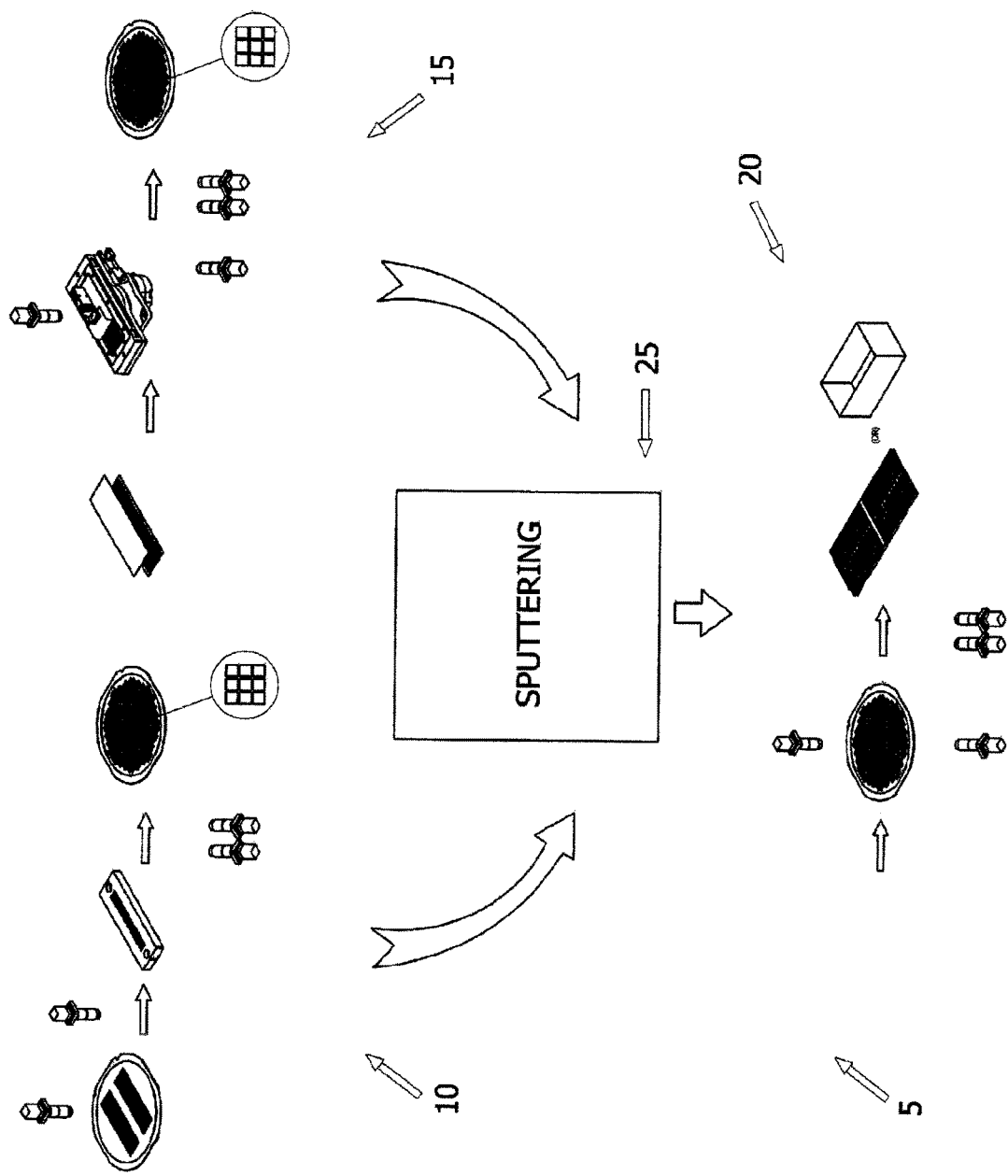
FIG. 1 is a schematic view of a process according to one embodiment of the present invention.

FIG. 1 shows a schematic view for the preparation 10, 15 of IC units prior to sputtering 25 and a supplementary process 20 for packaging the sputtered IC units. Various aspects of the invention relate to each of the preparatory processes 10, 15 and supplementary process 20, as well as the overall process 5.

Figure 2:
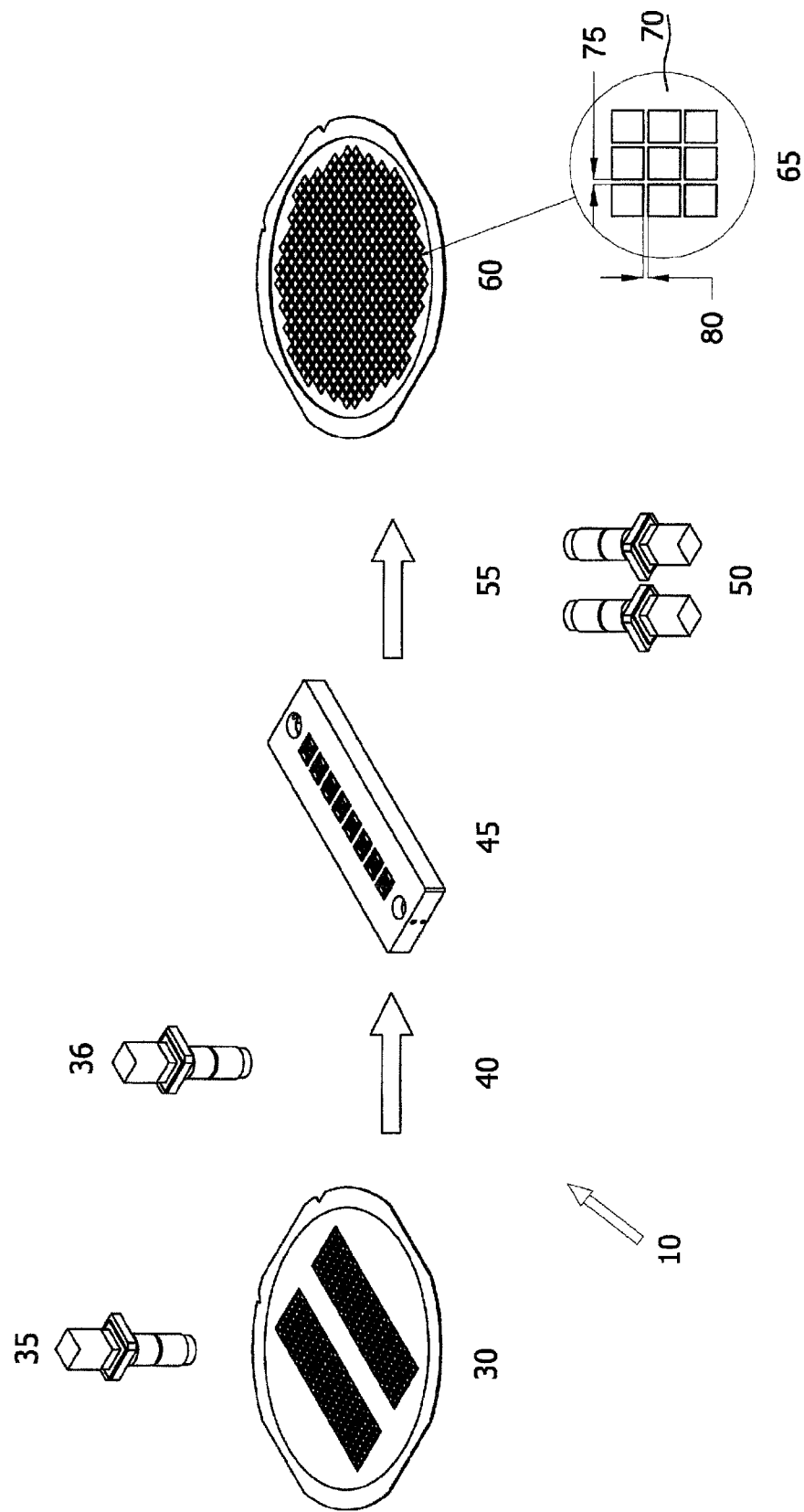
FIG. 2 is a schematic view of a preparatory process according to one embodiment of the present invention.

Looking at the first preparatory process 10 shown in FIG. 2, a film carrier frame 30 is provided to the process. The units undergo an alignment inspection 35, and then delivered 40 to a flipper 45 and in the process undergo a mark inspection 35 for checking of fiduciary marks. The units are then inverted and delivered 55 from the flipper 45 to a carrier frame 60. During the delivery step 55 the units undergo a side vision inspection 50. The unit picker, during the delivery step 55, is arranged to place the units onto the carrier frame 60 in an array 65 such that each of the units 70 are separated 75, 80 by a predetermined spacing. For instance, the spacing 75, 80 may be in a range 0.5 to 2.0 mm.

The delivery steps 40, 55 may be achieved by separate unit pickers or alternatively by the same unit picker having a rail spanning from the film carrier frame 30 to the sputtering film frame 60. The sputtering film frame 60 is then unloaded so as to undergo this sputtering process.

Figure 3:
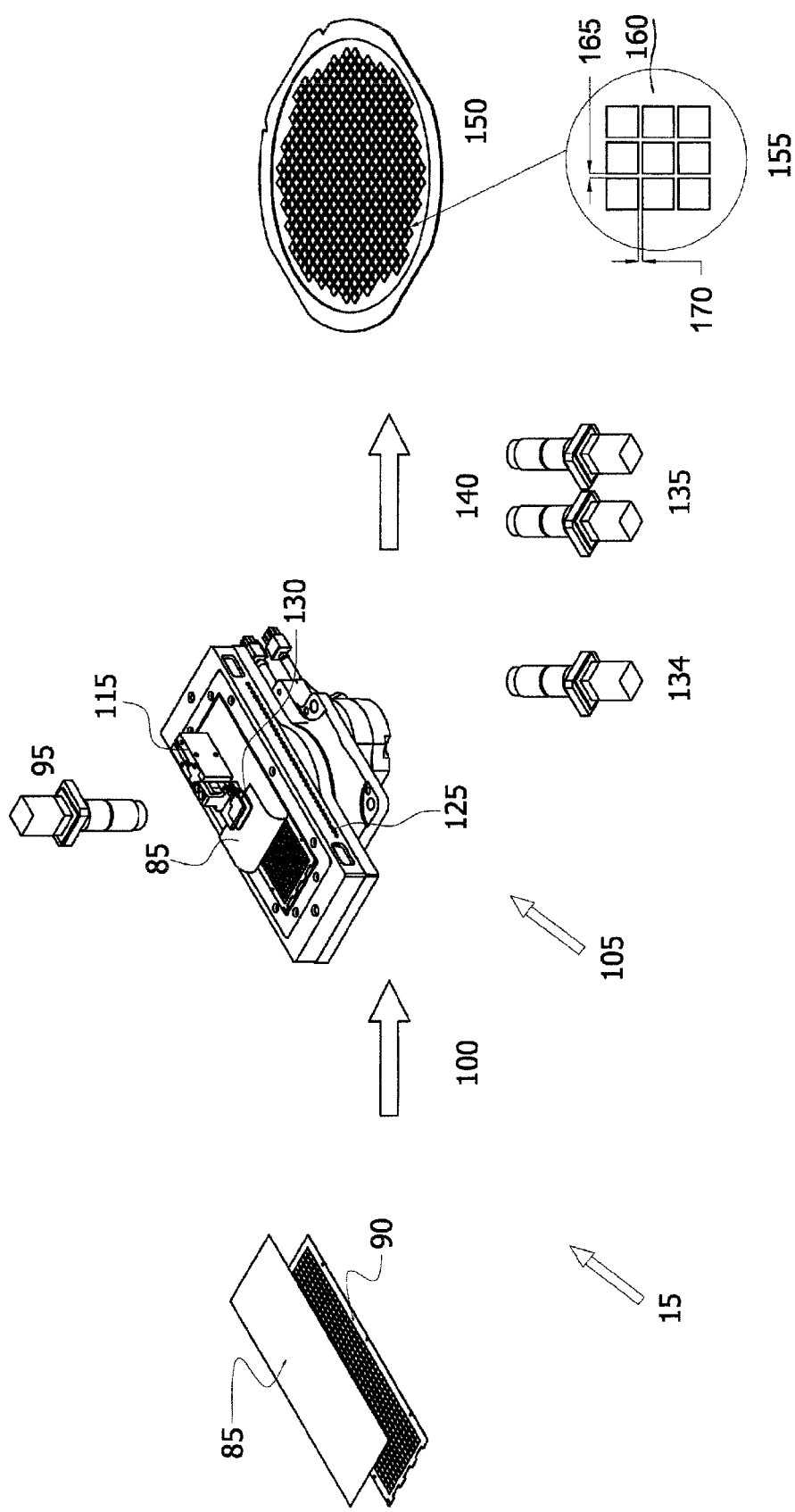
FIG. 3 is a schematic view of a preparatory process according to a further embodiment of the present invention.

FIG. 3 shows a schematic view of an alternative preparatory process 15. This process is arranged to receive the IC units in the form of a carrier 90 having the IC units secured through tape 85. The carrier 90 and tape 85 are delivered 100 to a tape removal unit 105. A pilot pin type device (not shown) is used for aligning the units between the carrier and tape removal unit 105.

In order to release the IC units from the carrier 90 the tape 85 is removed by the tape removal unit 105. Here, a gripper 130 engages the tape whilst a strong vacuum 125 is applied to the units and carrier 90. A slide 115 to which the gripper 130 is mounted applies a uniform force, peeling the tape from the units 90. Following removal of the tape 85, the vision 95 inspects for unit alignment.

As with the process of FIG. 2, the released units are then delivered 140 to a sputtering film frame 150 passing through a mark inspection 134 and then a side inspection 135 during the delivery step 140 which is performed by a unit picker.

As with FIG. 2 the process 15 of FIG. 3 is arranged such that the unit picker places the released units 160 in a predetermined array 155 having the unit separated 165, 170 in a predetermined arrangement.

The sputtering film frames 150 are subsequently delivered to the sputtering process (not shown).

Figure 4:
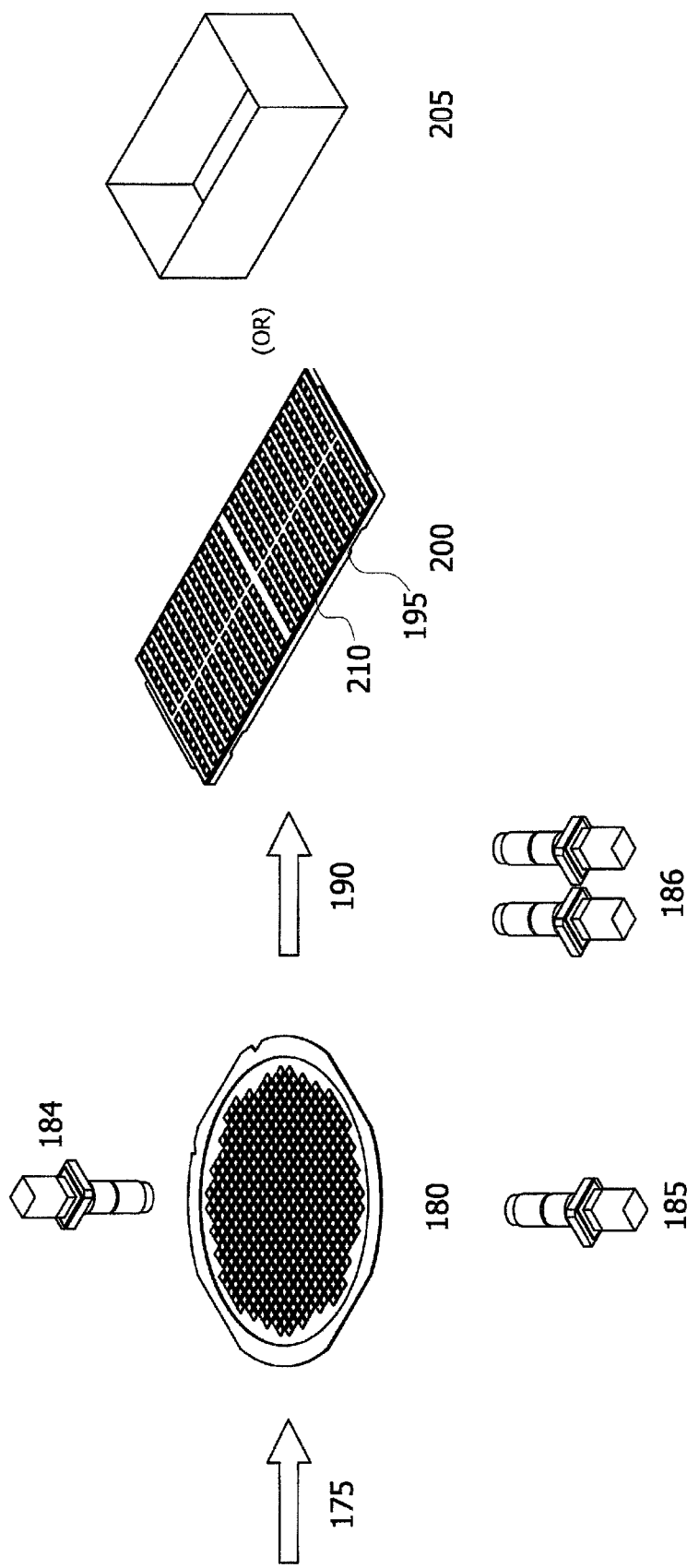
FIG. 4 is a schematic view of a supplementary process according to one embodiment of the present invention.

FIG. 4 shows a schematic view of a supplementary process 20 whereby sputtering film frames 180 are delivered 175 following the sputtering process. Here the units undergo a mark inspection 184, followed by an alignment inspection 185.

The sputtered units are delivered 190 via side inspection 186. The units are realigned by a precisor (not shown) for placement within a recess 210 of a tray 200. The units will be inspected on all sides whilst in the tray prior to being offloaded or alternatively placed in a bin 205.

Figure 5:
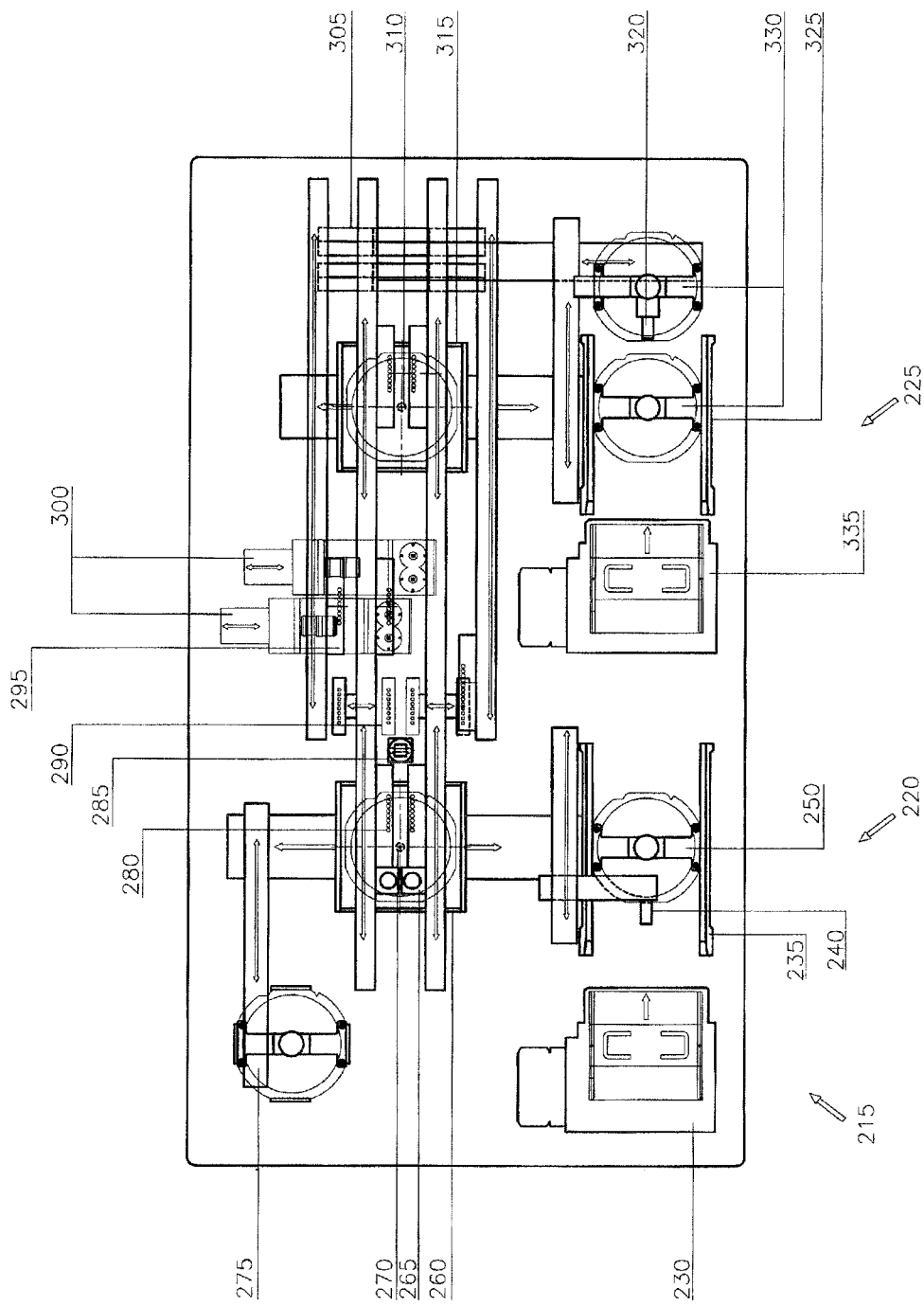
FIG. 5 is a plan view of a preparatory device according to one embodiment of the present invention.

FIG. 5 shows one embodiment of a preparatory process and in particular a machine layout corresponding to the schematic flow of FIG. 2.

As shown in FIG. 5, the machine layout 215 comprises two parts being the unit delivery portion 220 and the unit placement portion 225. In this particular embodiment the machine layout may be categorized as a film to film process in that it is arranged to receive film frames through a cartridge arrangement via the unloading elevated 230. Individual frames are engaged by a gripper 240 and brought into the apparatus via a rail 235 whereupon the frame is engaged by a frame picker 250.

The frame is delivered to a frame removal area by the frame picker 250 whereupon it is placed on a working table 260 and inspected by an alignment inspection camera 265. The units are removed from the frame by a package picker 280 and delivered to a flipper 290. During the delivery step, a further mark inspection 285 is carried out.

On removal of the packages to the flipper 290, the frame is ejected by an ejector 270 and removed by a frame offloader 275.

Following inversion by the flipper 290, a sorting picker delivers the unit to a further working table 315 with the units further inspected through a side vision inspection 300 prior to placement in a designated array on a sputtering film frame placed upon a working table 315. On successful transfer of the units, the sputtering film frame is ejected and carried to an offloading zone whereby the sputtering film frame is gripped 320 and placed within a frame picker 330 whereupon it is delivered along a rail 325 for offloading to a cartridge 335.

Units not meeting the requirement through any one of the previous inspection zones are placed in a bin 305 for disposal.

The cartridge, now being full of sputtering film frames, having units placed in an array suitable for sputtering can now be delivered to a sputtering process for future processing.

Figure 6:
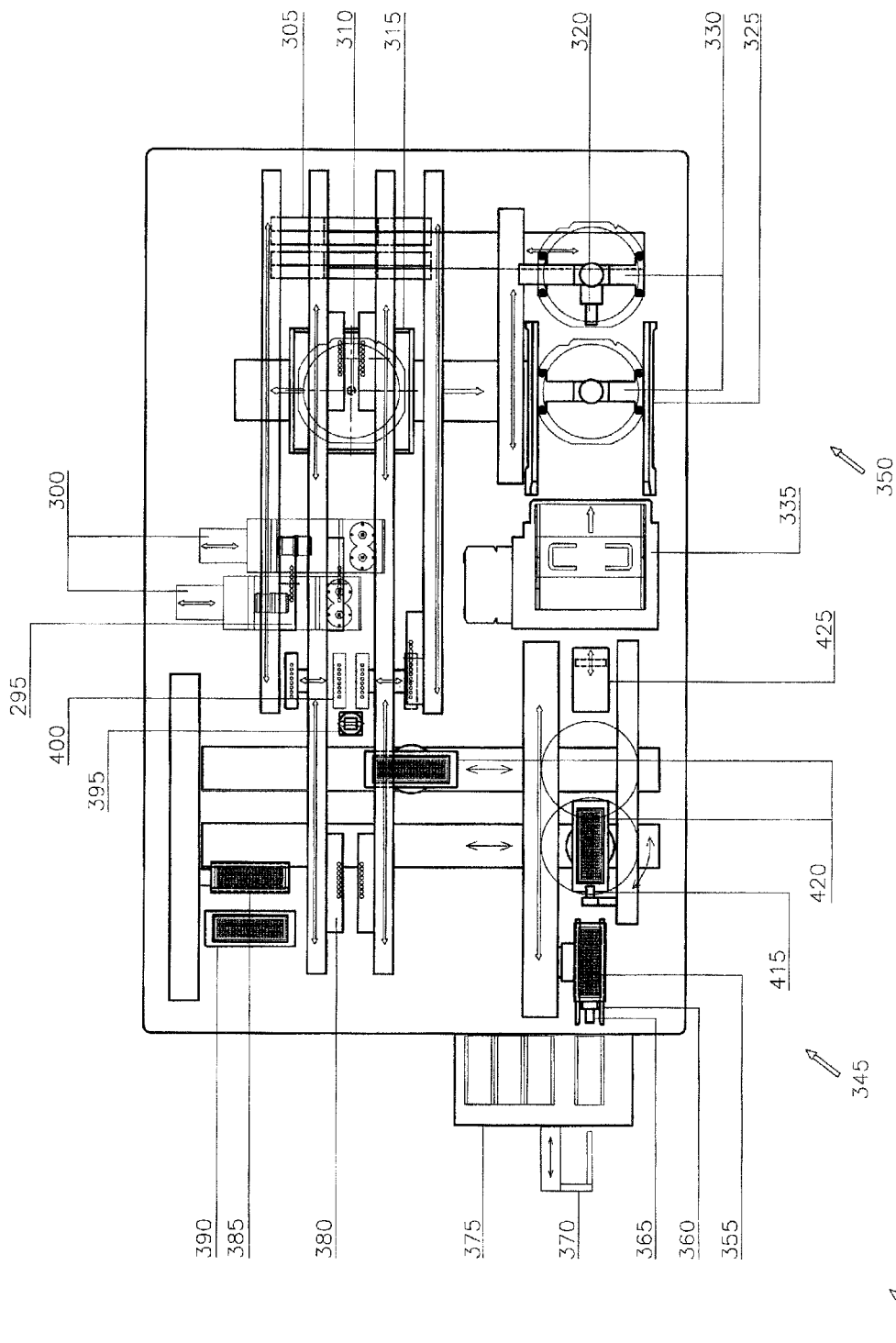
FIG. 6 is a plan view of a preparatory device according to a further embodiment of the present invention.

FIG. 6 shows an alternative arrangement whereby the machine layout 340 may be characterized as a carrier to film process.

Again there is a unit delivery zone 345 and a unit placement zone 350. However, in this arrangement the machine layout 340 has been designed for receiving carriers whereby the singulated units are engaged by a tape rather than film frames for which the units may be readily removed.

In this arrangement, a cassette magazine loader 375 includes a pusher 370 for inserting the carriers into an inlet rail 360 via a gripper 365. A carrier loading picker 355 then engages the carrier and delivers this to a tape removal device 415 whereby the units are released by removing the tape. The release carrier is then rotated on a turntable 420 and delivered along a rail whereby the units are delivered to a flipper 400 via a marked visioning inspection 395. The empty carriers are then unloaded by a picker 385 and placed within an elevator 390 for subsequent disposal.

The unit placement section 350 then follows the same path with the same equipment as that of the unit placement system of FIG. 5.

Accordingly, the process of FIG. 6 yields a full cartridge 335 for delivery to a sputtering process.

Figure 7:
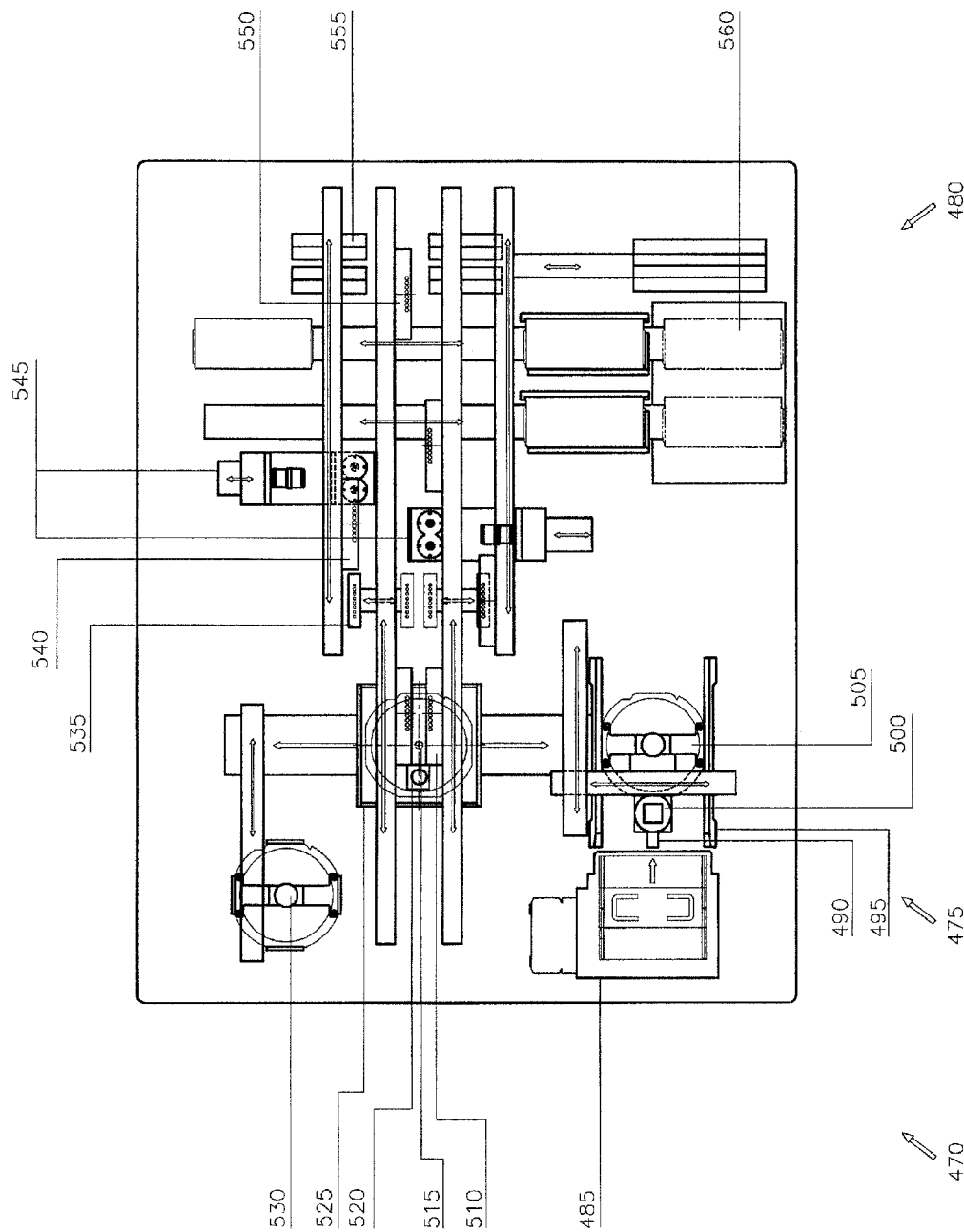
FIG. 7 is a plan view of a supplementary device according to a further embodiment of the present invention.

FIG. 7 shows a supplementary process having a machine layout 470. The machine layout includes a sputtering film frame receiving section 475 and an unloading section 480.

Following the sputtering process, the cartridge of sputtered film frames 485 is then delivered to an offloading section whereby a gripper 490 grips individual frames and draws them along a rail 495 to be engaged by a frame picker 505. A mark vision inspection 500 inspects the sputtered units during the delivery phase.

The sputtering film frame is then delivered to a work table 525 whereby a package picker 510 engages the sputtered units for subsequent offloading. An alignment vision inspection 520 adjacent to the ejector 515, inspects from below the package picker and through the tape, checking the alignment of the units to avoid misalignment of the units. On removal of the units, the frame is ejected by an ejector 515 and removed by a frame offloader 530. The sputtered units are delivered to a precisor 535 to realign the units into recesses of the module for subsequent placement by a sorting picker 540 into the trays for offloading 560. The sorting picker passes the sputtered units plus a side vision arrangement 545 and either places the units into a bin 555 or onto further sorting picker 550 for delivery to the tray offloader 560.

The invention claimed is:

1. A method for preparing a film carrier for sputtering of IC units placed thereon, the method comprising the steps of:
    providing a carrier of IC units;
    engaging the carrier and IC units with a vacuum;
    engaging a tape with a gripper;
    sliding the gripper along a slide whilst applying a uniform force to the tape;
    peeling the tape from the units, and so detaching the tape from the carrier so as to release said IC units, and then;

inspecting the units for alignment, then;
removing said IC units from the carrier;
delivering said IC units to a flipper;
inverting said IC units;
providing a sputtering film frame for receiving said IC units;
delivering said IC units to the sputtering film frame; and
placing the IC units on said sputtering film frame in an array having a pre-determined clearance about adjacent units.

2. The method according to claim 1, wherein the removing step precedes a step of ejecting the carrier.

3. The method according to claim 1, wherein the providing step precedes a step of inspecting the alignment of said IC units on said carrier.

4. The method according to claim 1, wherein the inverting step precedes a step of performing a second inspection of said inverted IC units.

5. The method according to claim 1, wherein the placing step precedes a step of conducting a side inspection of the IC units whilst on the sputtering film frame.

\* \* \* \* \*